US006768567B2

(12) United States Patent
Naulleau

(10) Patent No.: US 6,768,567 B2
(45) Date of Patent: Jul. 27, 2004

(54) SYNCHROTRON-BASED EUV LITHOGRAPHY ILLUMINATOR SIMULATOR

(75) Inventor: Patrick P. Naulleau, Oakland, CA (US)

(73) Assignee: EUV LLC, Santa Clara, CA (US)

(*) Notice: Subject to any disclaimer, the term of this patent is extended or adjusted under 35 U.S.C. 154(b) by 0 days.

(21) Appl. No.: 10/163,479

(22) Filed: Jun. 5, 2002

(65) Prior Publication Data

US 2003/0227657 A1 Dec. 11, 2003

(51) Int. Cl.[7] .................................................. G02B 5/32
(52) U.S. Cl. .......................... 359/15; 359/27; 359/351; 359/571; 378/34
(58) Field of Search ........................... 359/15, 27, 351, 359/1, 571; 378/34, 35, 36

(56) References Cited

U.S. PATENT DOCUMENTS

| | | | | |
|---|---|---|---|---|
| 6,262,845 B1 | * | 7/2001 | Sweatt | 359/571 |
| 6,469,827 B1 | * | 10/2002 | Sweatt | 359/351 |
| 2002/0186811 A1 | * | 12/2002 | Weiss | 378/34 |

OTHER PUBLICATIONS

Fienup, "Reconstruction of an object from the modulus of its Fourier transform", Optics Letters, Jul. 1978, 27–29, vol. 3, No. 1.

Gerchberg, et al., "A Practical Algorithm for the Determination of Phase from Image and Diffraction Plane Pictures", OPTIK, vol. 35 (No. 2), pps. 237–246 (1972).

Roychoudhuri, et al., "Application of Local Reference Beam Holography to the Study of Laser Beam Parameters", Optical Engineering, pps. 347–353, Jul./Aug. 1974.

* cited by examiner

Primary Examiner—Drew A. Dunn
Assistant Examiner—Leo Boutsikaris
(74) Attorney, Agent, or Firm—Fliesler Meyer LLP

(57) ABSTRACT

A lithographic illuminator to illuminate a reticle to be imaged with a range of angles is provided. The illumination can be employed to generate a pattern in the pupil of the imaging system, where spatial coordinates in the pupil plane correspond to illumination angles in the reticle plane. In particular, a coherent synchrotron beamline is used along with a potentially decoherentizing holographic optical element (HOE), as an experimental EUV illuminator simulation station. The pupil fill is completely defined by a single HOE, thus the system can be easily modified to model a variety of illuminator fill patterns. The HOE can be designed to generate any desired angular spectrum and such a device can serve as the basis for an illuminator simulator.

29 Claims, 4 Drawing Sheets

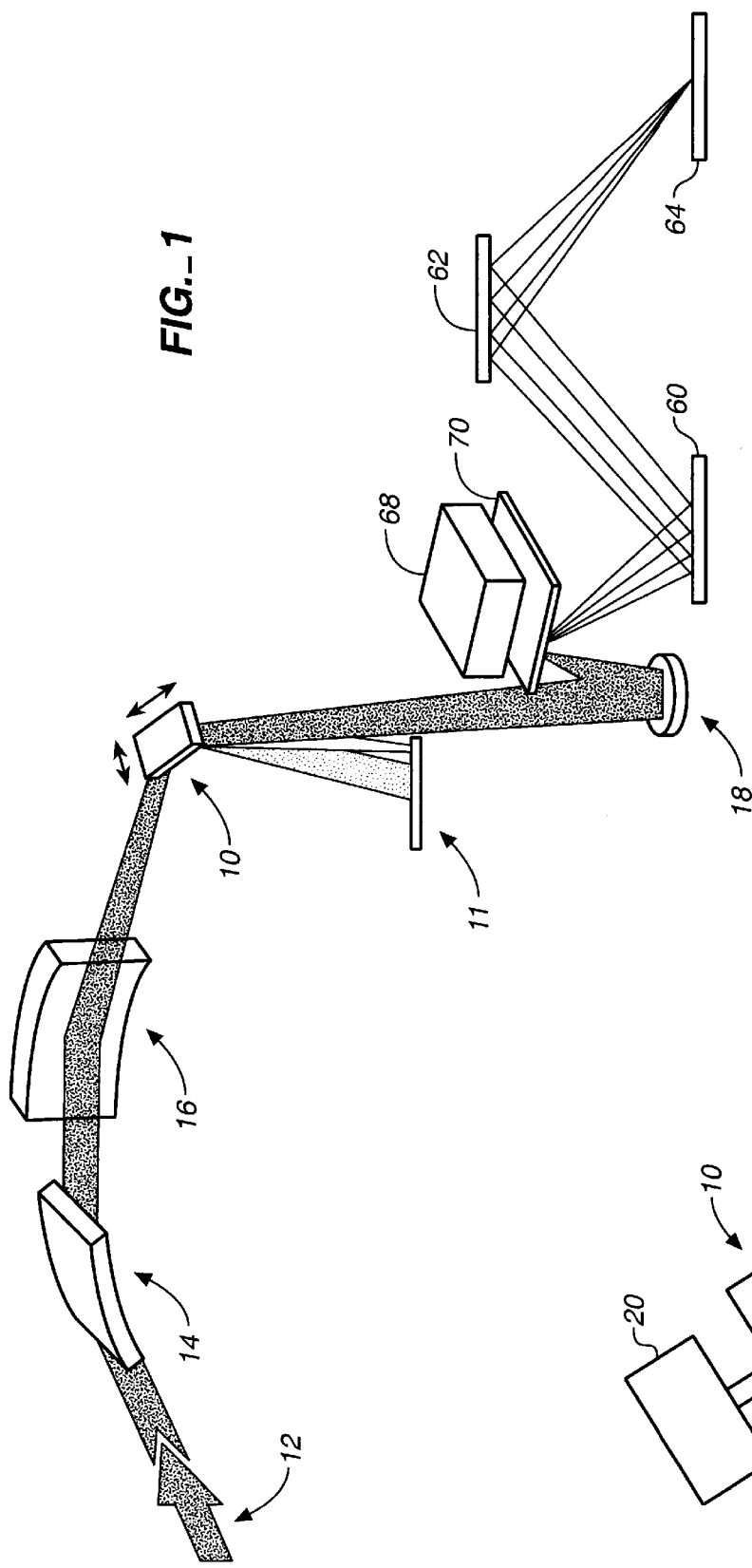

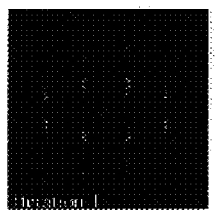 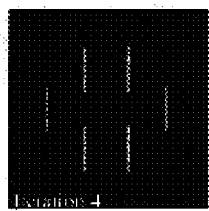 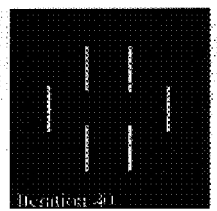 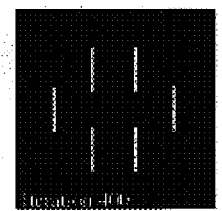
FIG._3A     FIG._3B     FIG._3C     FIG._3D
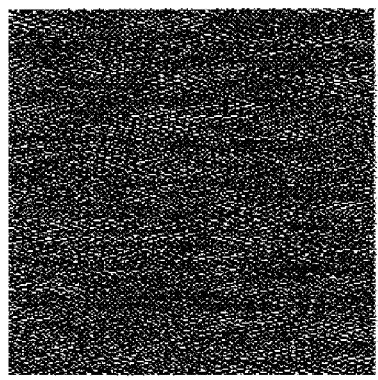 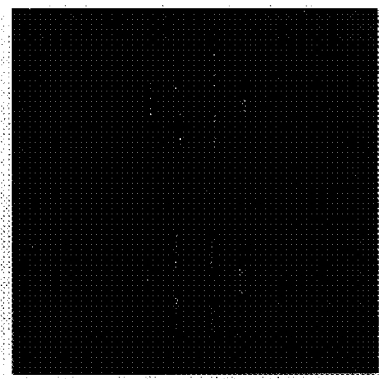
FIG._4A     FIG._4B
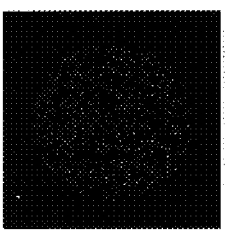 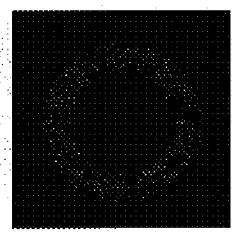 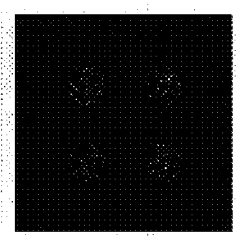 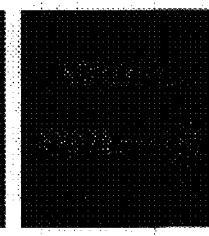
FIG._5A     FIG._5B     FIG._5C     FIG._5D
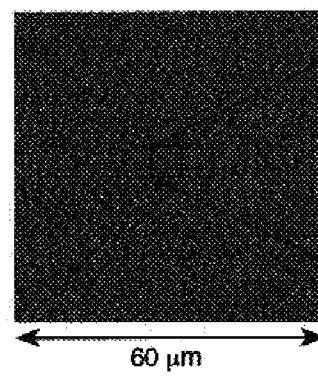 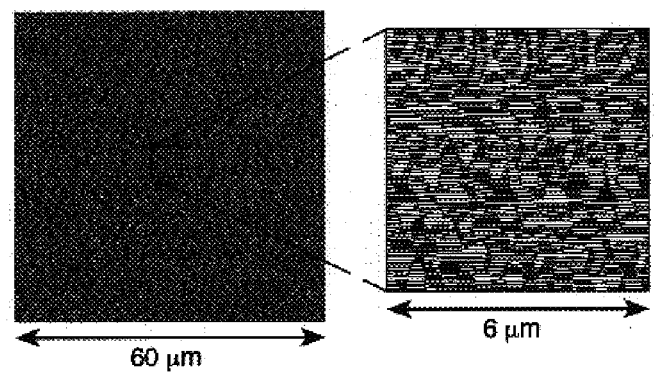
FIG._6A   60 μm     FIG._6B   6 μm

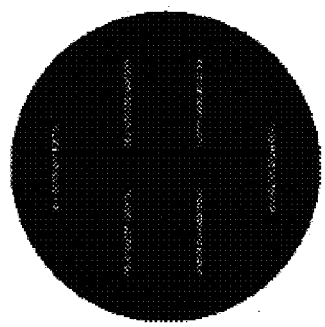
*FIG._7*
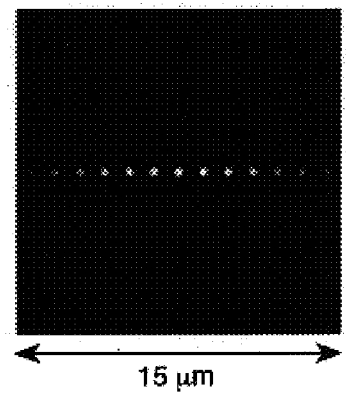
15 μm
*FIG._8*
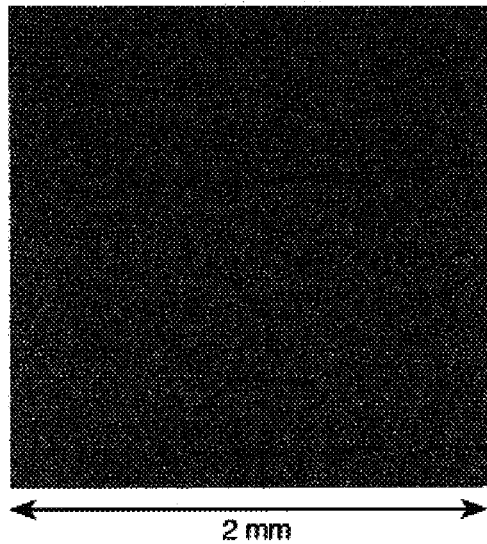
2 mm
*FIG._9A*
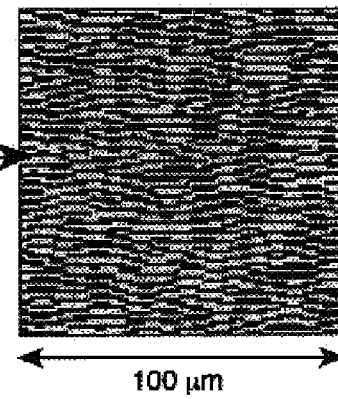
100 μm
*FIG._9B*
*FIG._9C*
*FIG._10*

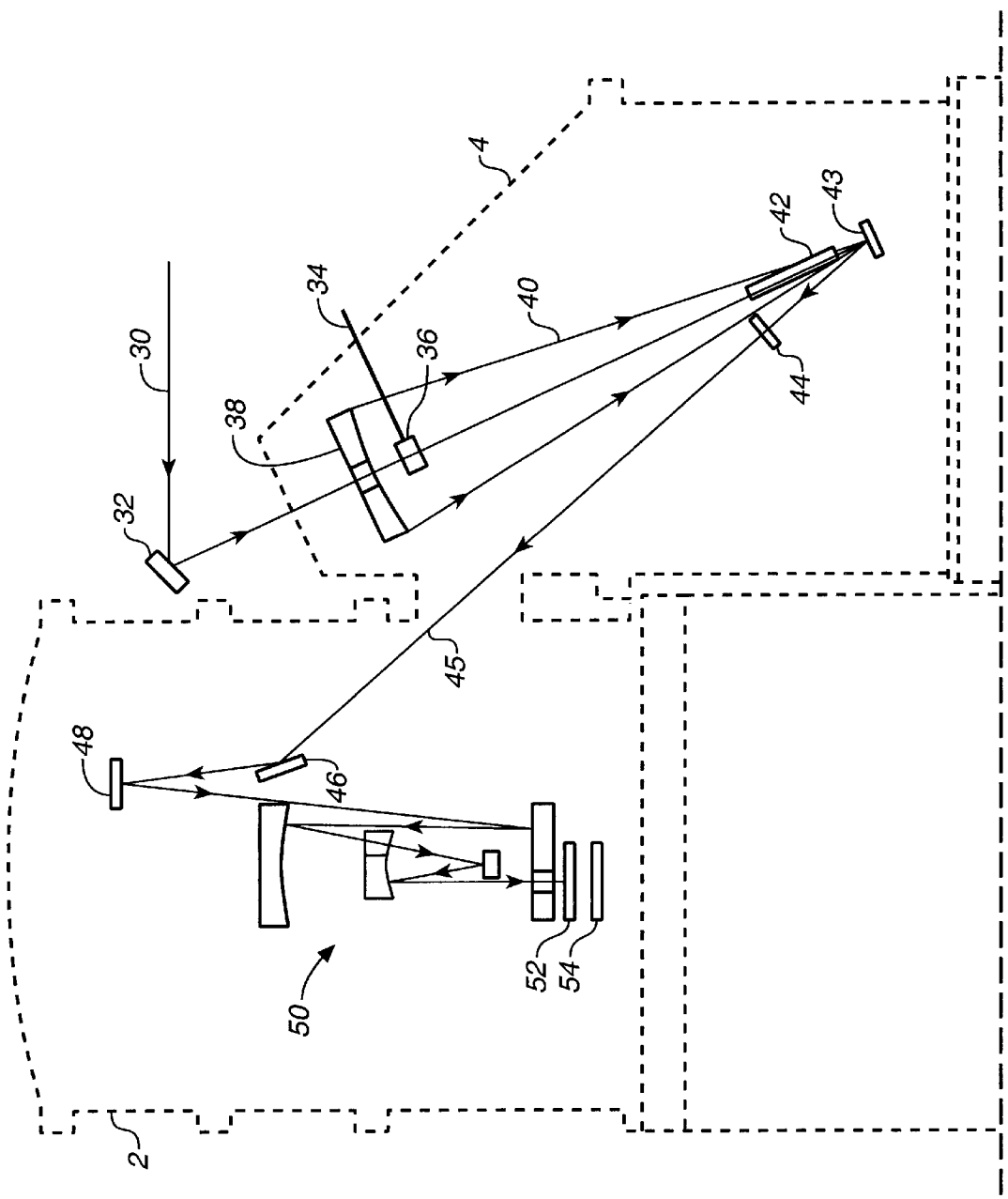
FIG._11
(PRIOR ART)

SYNCHROTRON-BASED EUV LITHOGRAPHY ILLUMINATOR SIMULATOR

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

EUV lithography (EUVL) is an emerging technology in the microelectronics industry. It is one of the leading candidates for the fabrication of devices with feature sizes of 70 nm and smaller. Synchrotron radiation facilities provide a convenient source of EUV radiation for the development of this technology. This invention relates to techniques for generating arbitrary fill patterns that simulate actual fill patterns for potential stepper designs, or generate specialized fill patterns for more general optical processing systems.

BACKGROUND OF THE INVENTION

In general, lithography refers to processes for pattern transfer between various media. A lithographic coating is generally a radiation-sensitized coating suitable for receiving a cast image of the subject pattern. Once the image is cast, it is indelibly formed in the coating. The recorded image may be either a negative or a positive of the subject pattern. Typically, a "transparency" of the subject pattern is made having areas which are selectively transparent or opaque to the impinging radiation. Exposure of the coating through the transparency placed in close longitudinal proximity to the coating causes the exposed area of the coating to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing and has supplanted proximity printing as described in the previous paragraph. "Long" or "soft" x-rays (a.k.a. Extreme UV) (wavelength range of 10 to 20 nm) are now at the forefront of research in efforts to achieve smaller transferred feature sizes. With projection photolithography, a reticle (or mask) is imaged through a reduction-projection (demagnifying) lens onto a wafer. Reticles for EUV projection lithography typically comprise a glass substrate coated with an EUV reflective material and an optical pattern fabricated from an EUV absorbing material covering portions of the reflective surface. In operation, EUV radiation from the illumination system (condenser) is projected toward the surface of the reticle and radiation is reflected from those areas of the reticle reflective surface which are exposed, i.e., not covered by the EUV absorbing material. The reflected radiation is re-imaged to the wafer using a reflective optical system and the pattern from the reticle is effectively transcribed to the wafer.

A source of EUV radiation is the laser-produced plasma EUV source, which depends upon a high power, pulsed laser (e.g., a yttrium aluminum garnet ("YAG") laser), or an excimer laser, delivering 500 to 1,000 watts of power to a 50 $\mu$m to 250 $\mu$m spot, thereby heating a source material to, for example, 250,000 C, to emit EUV radiation from the resulting plasma. Plasma sources are compact, and may be dedicated to a single production line so that malfunction does not close down the entire plant. A stepper employing a laser-produced plasma source is relatively inexpensive and could be housed in existing facilities. It is expected that EUV sources suitable for photolithography that provide bright, incoherent EUV radiation and that employ physics quite different from that of the laser-produced plasma source will be developed. One such source under development is the EUV discharge source.

EUV lithography machines for producing integrated circuit components are described for example in Tichenor et al. U.S. Pat. No. 6,031,598. Referring to FIG. 11, the EUV lithography machine comprises a main vacuum or projection chamber 2 and a source vacuum chamber 4. Source chamber 4 is connected to main chamber 2 through an airlock valve (not shown) which permits either chamber to be accessed without venting or contaminating the environment of the other chamber. Typically, a laser beam 30 is directed by turning mirror 32 into the source chamber 4. A high density gas, such as xenon, is injected into the plasma generator 36 through gas supply 34 and the interaction of the laser beam 30, and gas supply 34 creates a plasma giving off the illumination used in EUV lithography. The EUV radiation is collected by segmented collector 38, that collects about 30% of the available EUV light, and directed toward the pupil optics 42. The pupil optics consists of long narrow mirrors arranged to focus the rays from the collector at grazing angles onto an imaging mirror 43 that redirects the illumination beam through filter/window 44. Filter 44 passes only the desired EUV wavelengths and excludes scattered laser beam light in chamber 4. The illumination beam is then reflected from the relay optics 46, another grazing angle mirror, and then illuminates the pattern on the reticle 48. Mirrors 38, 42, 43, and 46 together comprise the complete illumination system or condenser. The reflected pattern from the reticle 48 then passes through the projection optics 50 which reduces the image size to that desired for printing on the wafer. After exiting the projection optics 50, the beam passes through vacuum window 52. The beam then prints its pattern on wafer 54.

Although no longer under serious consideration for high-volume commercial fabrication applications, synchrotron sources play an extremely important role in the development of EUV lithography technology. Being readily available, highly reliable, and efficient producers of EUV radiation, synchrotron radiation sources are well suited to the development of EUV lithography. These sources are currently used for a variety of at-wavelength EUV metrologies such as reflectometry, interferometry, and scatterometry.

In the case of synchrotron radiation sources, there are three types of sources: bending magnets, wigglers, and undulators. In bending magnet sources, the electrons are deflected by a bending magnet and photon radiation is emitted. Wiggler sources comprise a so-called wiggler for the deflection of the electron or of an electron beam. The wiggler includes a multiple number of alternating poled pairs of magnets arranged in a series. When an electron passes through a wiggler, the electron is subjected to a periodic, vertical magnetic field; the electron oscillates correspondingly in the horizontal plane. Wigglers are further characterized by the fact that no interference effects occur. The synchrotron radiation produced by a wiggler is similar to that of a bending magnet and radiates in a horizontal steradian. In contrast to the bending magnet, it has a flux that is reinforced by the number of poles of the wiggler.

Finally, in the case of undulator sources, the electrons in the undulator are subjected to a magnetic field with shorter periods and a smaller magnetic field of the deflection pole than in the case of the wiggler, so that interference effects of synchrotron radiation occur. Due to the interference effects, the synchrotron radiation has a discontinuous spectrum and radiates both horizontally and vertically in a small steradian element, i.e., the radiation is strongly directed.

In lithographic applications, the partial coherence of the illumination (sigma) is often defined as the ratio of the illumination angular range to the numerical aperture of the imaging (projection optical) system. The illumination angular range is also referred to as the divergence of the source. Undulator radiation is much like a laser source in that it produces highly-coherent light of very low divergence. A typical EUV undulator beamline produces a sigma of less than 0.1 whereas lithographic application nominally require a sigma of 0.7 or higher. Although less coherent than undulator radiation, bending magnet radiation is also typically too coherent to be directly used for lithography.

Currently the coherence and high flux properties of synchrotron undulator radiation are being used for crucial at-wavelength interferometry and alignment of complex EUV lithography optics. These interferometry results can be used to predict imaging performance, however, the final performance metric must always be actual imaging. In addition, the properties of the illuminator (condenser) play an important role in the final imaging performance. To study the effectiveness of various illuminator designs, it would be beneficial to have an illuminator simulator that generates arbitrary pupil-fill patterns and that affords a simple transition between theses patterns. Such a device is nearly impossible to achieve using conventional illuminators comprised of numerous, complicated optics; thus, novel-illuminator performance studies are typically limited to computer simulations.

SUMMARY OF THE INVENTION

The function of a lithographic illuminator is essentially to illuminate the reticle to be imaged with a range of angles. The present invention is based, in part, on the recognition that the illumination can be employed to generate a pattern in the pupil of the imaging system, where spatial coordinates in the pupil plane correspond to illumination angle in the reticle plane. Specifically, a coherent synchrotron beamline is used along with a potentially decoherentizing holographic optical element (HOE), as an experimental EUV illuminator simulation station. The pupil fill is completely defined by a single HOE, thus the system can be easily modified to model a variety of illuminator fill patterns. Also the HOE allows the generated pupil fill pattern to be arbitrary. Because a HOE can be designed to generate any desired angular spectrum such a device can serve as the basis for an arbitrary illuminator simulator. It should be noted that a valid simulation of the pupil fill effects also requires the individual angles produced by the HOE to be mutually incoherent. Achieving this condition requires that the HOE be moved relative to the stationary, coherent, illumination beam such that many thousand correlation lengths are covered over the total image integration (exposure) time.

The HOE can be a transmission or reflection device and can be readily implemented using a binary phase or amplitude carrier. At EUV wavelengths, the preferred embodiment uses a binary phase carrier HOE generated by fabricating a binary relief structure onto a smooth substrate and overcoating the device with a conventional reflective EUV multilayer. Positioning the HOE such that it coincided with an existing mirror optimizes the efficiency of the system. In the preferred embodiment, the HOE serves as the effective source in a critical illumination system. The HOE is re-imaged to the reticle by way of a spatial filter system that removes all but the desired holographic order. In this case the reticle plane illumination is set by the illumination of the HOE itself and the pupil fill is set by the far-field diffraction of the HOE. It is also possible to use the HOE in a Köhler configuration where the reticle illumination pattern is set by the HOE diffraction pattern and the pupil fill is set by the HOE illumination pattern.

As with any illuminator relying on a passive element to reduce the coherence of a coherent beam, the HOE must be moved at a rate fast relative to the observation (exposure) time in order for the desired coherence modification to be achieved. Without motion, the HOE creates the requisite multiple angles of illumination, however, the light at each of these illumination angles remains mutually coherent as they are all derived from a single coherent beam. Incoherence requires both multiple angles of incidence and mutual incoherence of all these angles. This can be effectively achieved by rapid motion of the HOE. The HOE, however, cannot simply be rotated as is typically done with conventional diffusers because this would cause the carrier to rotate in space. Instead, the HOE must be translated in x and y only.

In one embodiment, the invention is directed to an illuminator device, for an optical image processing system, wherein the image processing system comprises an optical system that employs an arbitrary pupil fill pattern, and wherein the illuminator device includes:

a source of coherent or partially coherent radiation;

a holographic optical element (HOE) having a surface that receives incident radiation from said source; and a condenser optic that re-images a surface of the holographic optical element to the entrance of said image processing system.

In another embodiment, the invention is directed to a method of generating an arbitrary pupil fill pattern in the entrance of an image processing system that includes the steps of:

(a) directing incident radiation onto a surface of a holographic optical element (HOE) wherein the radiation is coherent or partially coherent radiation; and (b) re-imaging the surface of the HOE to the entrance of the image process system.

BRIEF DESCRIPTION OF THE DRAWINGS

FIGS. 1 and 2 illustrate a configuration of the synchrotron based illuminator;

FIGS. 3A, 3B, 3C, and 3D illustrate phase-only HOE modulating function diffraction patterns for various iteration number;

FIGS. 4A and 4B illustrate an actual HOE pattern and far-field diffraction from HOE;

FIGS. 5A, 5B, 5C, and 5D illustrate diffraction patterns from phase-only HOEs using binary phase-only carrier;

FIGS. 6A and 6B illustrate a 60 $\mu$m HOE and an enlarged 6-$\mu$m central region, respectively;

FIG. 7 illustrates a pupil fill generated by HOE depicted in FIG. 6A (full pictured object side numerical aperture is 0.025);

FIG. 8 illustrates the coherence function as simulated in the object plane;

FIGS. 9A and 9B illustrate a calculated HOE pattern and FIG. 9C illustrates the calculated far-field diffraction pattern;

FIG. 10 illustrates two orders (the desired pattern and its complex conjugate) of the HOE diffraction pattern under He—Ne illumination; and FIG. 11 illustrates a prior art EUV lithography machine.

DETAILED DESCRIPTION OF THE PREFERRED EMBODIMENTS

FIG. 1 shows a schematic of a preferred embodiment of the illuminator wherein an effectively coherent synchrotron radiation beam 12 is delivered to moving holographic optical element (HOE) 10 by way of conventional beamline optics 14,16. The HOE redirects the beam towards relay mirror 18. As shown in FIG. 2, the movement of HOE 10 can be controlled by translation mechanisms 20, 22 such that the HOE 10 is able to be translated linearly in the plane of the holographic surface. The speed of this translation should be rapid enough such that many, preferably about 1000 or more, correlation lengths of the holographic diffuser are spanned during the imaging system's exposure, or integration, time. These translation mechanisms could consist of commercially available x-y stages.

The use of a HOE presents two challenges over using a conventional diffuser. The first is the presence of the zero order which must be eliminated prior to illuminating the reticle 70 and the second is the increased spatial resolution demands on the lithography. The spatial carrier in the HOE has the effect of increasing the resolution requirements by, at least, a factor of 4. Both these limitations can be overcome by implementing a demagnifying spatial-filtering system after the HOE. The demagnifying system can comprise a simple spherical relay mirror 18 used to re-image the diffuser to the reticle. The spatial filtering is provided by a spatial filter or stop 11 that is positioned between the HOE and the spherical mirror that selects only the one holographic order of interest. Order separation is achieved in the stop plane by properly choosing the spatial-carrier frequency in the HOE and having the incoming illumination beam focused to the stop plane. As depicted in FIG. 1, the spatial filter 11 can be designed to also block other diffracted orders, e.g., −1 and/or +1, in addition to the zero order; in this case, the −1 order is also eliminated. The spatial filter should be made of an EUV absorbing material.

The relay mirror 18 function is preferably provided by a single conventional concave spherical mirror, whose surface forms part of a sphere. Although the embodiments described herein employ spherical mirrors for convenience and economical concerns, it is intended that other mirrors be covered by the present invention, such as toroidal, and conic section, e.g., parabolic, hyperbolic, general aspheric, elliptical, cylindrical, etc., mirrors which may be substituted for spherical mirrors within tolerable industry standards, including those with minor flaws or aberrations. Also, the function of the single element relay mirror 18 could be provided by a more complex multi-element optical system.

In the case of a "critical" illumination system as shown in FIG. 1, spherical relay mirror 18 is an imaging mirror that re-images the HOE 10 onto the illumination plane of interest. For the lithographic system described here, this illumination plane corresponds to reticle 70, which is mounted on reticle stage 68. For the lithographic system, the reticle plane is the entrance plane and the "imaging processing system" is lithographic projection optics 60, 62. Suitable lithographic optics are described in Hudyma et al. U.S. Pat. Nos. 6,226, 346, 6,188,513, 6,072,852 and 6,033,079 which are incorporated herein by reference. Alternatively, the image-processing system could be, instead of a lithographic optic, another type of system such as a microscope or spatial filtering system.

For lithographic applications, the illumination that is produced by the holographic diffuser 10 typically has a partial coherence (sigma) that ranges from about 0.3 to 1; for many applications the illumination has a partial coherence of about 0.7.

A preferred source of the coherent or partially coherent radiation is a synchrotron radiation source, which is a broadband source capable of operating from the X-ray through infrared regimes. The synchrotron is constructed from a storage ring providing for relativistic electrons or positrons confined by magnetic fields to a repeating orbital path. A suitable source is the synchrotron undulator beamline source (CXRO beamline 12.0.1.2 at the Advanced Light Source, Lawrence Berkeley National Laboratory) operating at a wavelength of 13.4 nm with a bandwidth $\lambda/\Delta\lambda$ of about 200.

Given a desired far-field diffraction pattern, the corresponding HOE can be calculated as one would calculate the Fourier-transform hologram of the diffraction pattern. This is done by calculating the Fourier transform of the desired pattern and modulating a spatial carrier using the resulting complex-valued Fourier transform. The ideal HOE will have a sinusoidal carrier and will include both amplitude (contrast) and phase modulation of the carrier.

In the visible-light regime, an ideal HOE could be readily recorded by recording a Fourier-transform hologram of the desired diffraction pattern generated by some other means. At EUV wavelengths, however, the process is not so convenient due to lack of equivalent holographic film. In practice, the process is typically limited to calculating the HOE as described above and using lithographic techniques to generate the pattern or a reasonable approximation of the pattern.

The HOE could be a transmission device that is fabricated by applying the same techniques used when fabricating gratings for EUV interferometry. The gratings can be either amplitude or molybdenum phase gratings. One advantage of using molybdenum phase gratings is increased efficiency. Alternatively, the HOE could be fabricated as a reflection device using methods similar to those used to generate high-efficiency reflection EUV blazed-phase gratings, which are described in Naulleau U.S. Pat. No. 6,266,147, which is incorporated herein.

When lithographically fabricating a computer-generated HOE it is difficult to pattern the ideal modulated sinusoidal carrier. In practice, the process is typically restricted to binary patterns making amplitude modulation of the carrier impossible. While amplitude modulation can be effectively achieved through duty-cycle modulation, however, it is often adequate to employ phase-only modulation, facilitating the fabrication process. Furthermore, in the "critical" configuration is it preferable to have phase-only modulation because any amplitude modulation would become illumination non-uniformity at the reticle plane.

When calculating the modulating function for a phase-only HOE intended to produce a specific diffraction pattern, two parameters are known: 1) the magnitude of the Fourier transform of the modulating function (the desired diffraction pattern) and 2) the amplitude of the modulating function (unity because it is a phase-only device). The problem is, thus, to determine the phase of the HOE (object) given the amplitude of its Fourier transform. This problem is similar to the astronomical problem of reconstructing an object given the magnitude of the Fourier transform of the object.

To address this problem, several so-called phase retrieval algorithms have been developed based on iterative techniques. (See, R. Gerchberg and W. Saxon, "A practical algorithm for the determination of phase image and diffraction plane pictures", Optik 35, 237–246 (1972) and J. Fienup, "Reconstruction of an objection from the modules of its Fourier Transform", Opt. Lett., 3, 27–29 (1978), which are incorporated herein.) These techniques can be applied to phase-only HOE calculations.

One implementation of the iterative technique (the error-reduction method) employs the following steps:

(1) generate the desired magnitude diffraction pattern, $D'(f_x, f_y)$ (2) generate the seed diffraction pattern for calculation process, $D(f_x, f_y)$ (most conveniently unity)

(3) enforce constraints on $D(f_x, f_y)$ [multiply by the desired magnitude diffraction pattern, $D'(f_x, f_y)$]

(4) inverse Fourier transform $D(f_x, f_y)$ obtaining guess at the modulating signal, $d(x,y)$ (5) enforce constraints on $d(x,y)$ (force the amplitude to be unity)

(6) fourier transform $d(x,y)$ to generate resulting diffraction pattern, $D(f_x, f_y)$ (7) repeat steps 3 through 6 until the magnitude of the result of step 6 matches the desired magnitude diffraction pattern.

The iterative method described above has been used to calculate a phase-only HOE modulating function capable of generating an approximation to the pupil fill used in a lithography Engineering Test Stand (ETS) developed jointly by EUV LLC and the Virtual National Lab (VNL). The ETS uses a unique 6-channel illuminator approximating a sigma of 0.7. FIGS. 3A, 3B, 3C, and 3D show the resulting HOE modulating function diffraction pattern for various iteration numbers, namely, iterations 1, 4, 40, and 400, respectively.

This modulating function must then be placed onto a spatial carrier to generate the actual HOE. As stated above, at EUV we are typically limited to binary carriers, either amplitude or phase. FIGS. 4A and 4B show the resulting binary-phase carrier HOE as well as the diffraction pattern. The diffraction pattern contains both the desired pattern and its complex conjugate, the zero-order term is suppressed due to the phase-only carrier. The speckle seen in the actual HOE diffraction pattern (FIG. 4A) is a result of the binary, resolution-limited carrier, and is inconsequential for the illuminator system described here.

The method described above can be applied to any arbitrary fill pattern. FIGS. 5A, 5B, 5C and 5D show the HOE diffraction patterns from HOEs designed for tophat, annular, quadrapole, and an arbitrary pattern comprised of two designs designated VNL and EUVL, respectively. The speckle is again a result of the binary, resolution-limited carrier. As described herein, this speckle will be averaged away by the requisite motion of the HOE.

It is important to note that illumination partial coherence requires the individual spatial-frequency (angular) components to be mutually incoherent. The pupil plane images shown in FIGS. 4 and 5 represent the angular spectrum of the reticle-plane illumination. To have partial coherence requires that each point in the pupil map (far-field diffraction pattern) be incoherent with all other points. Clearly this condition would not be achieved by simply illuminating the stationary HOE with a coherent beam.

The partial-coherence condition can, however, be met by generating a HOE that is larger than the illumination area of interest and moving the HOE relative to the illuminating beam during the exposure. This also requires the phase of the diffraction pattern generated by the HOE to have a negligible correlation length relative to the pupil diameter. The random phase condition is readily met by seeding the iterative HOE calculation process described above with a random phase term instead of using the unity seed described above.

As mentioned above, the HOE must be moved relative to the illumination beam during an exposure. Coherence control requires the HOE to be moved through approximately, at least, 1000 correlation lengths of the HOE. However, the illumination uniformity is approximately $1/\sqrt{N}$ where N is the number of correlation cycles integrated over. For example, if only a single correlation cycle is sampled, the illumination pattern will be a fully developed speckle pattern. The contrast of the speckle pattern (or the illumination uniformity) will go as $1/\sqrt{N}$. A 1% uniformity would thus require about 10,000 correlation lengths to be covered. The speckle contrast in the pupil-fill pattern will also decrease at the same rate.

The correlation length of the HOE is readily determined from the bandwidth of the HOE carrier-centered signal. For an illustrative 6-channel illuminator (that used in the ETS), this bandwidth is effectively the object-side numerical aperture of the projection optics (NA=0.025) times the effective illuminator partial coherence (sigma=0.7). This yields a single-sided angular bandwidth of 0.0175 and a correlation length on the order of 0.5 $\mu$m. Assuming two-dimensional motion of the HOE, moving through 10,000 correlation lengths requires the HOE to be approximately 50 $\mu$m larger than the desired illumination size in each direction. Thus, the required motion of the HOE does not significantly affect the required HOE size nor is it very demanding from the mechanical motion point of view.

The coherence-control characteristics described above have been verified by way of physical-optics modeling of the HOE illuminator. Using the method described above, an HOE that is 60×60 $\mu$m large producing the ETS pupil fill is generated. The pixel size in the HOE is 29 nm. It is noted that the pixel size was determined primarily based on numerical simulation considerations rather than physical patterning resolution requirements. Although available electron-beam lithography tools can achieve this resolution, a 4-times lower patterning resolution (about 100 nm) would be adequate under the unity magnification condition between the HOE and the reticle. Even lower patterning resolution could be used in the case where a demagnifying system is used to re-image the HOE to the reticle.

The physical-optics simulation considered here assumes a unity magnification system to be used as part of the spatial filter that re-images the HOE to the reticle. Due to numerical processing limitations, the illumination area considered in this simulation is limited to 15×15 $\mu$m at the reticle (by definition the same illumination size is considered on the HOE). Because the coherence function is expected to be much smaller than 15 $\mu$m, this calculation limitation is not consequential.

The simulation works by considering a coherently illuminated 15×15 $\mu$m area on the HOE and calculating the coherent reticle-plane distribution. To model the motion of the HOE, the 60×60 $\mu$m HOE is then displaced relative to the 15 $\mu$m illumination area by about 0.25 $\mu$m and a new realization of the coherent reticle-plane distribution is calculated. This process is repeated until the entire 60×60 $\mu$m HOE area is covered. The independent realizations are summed in power to derive the time-integrated illumination obtained under the condition of the moving HOE.

The coherence function is determined by simulating the recording of a time-integrated hologram of the illumination where the center of the illumination pattern placed onto a spatial carrier is used as the reference beam. This models the well-established holographic method for measuring spatial coherence. (See, C. Roychoudhuri and B. J. Thompson, "Application of local reference beam holography to the study of laser beam parameters," Opt. Eng. 13, 347–353 (1974), which is incorporated herein.) Reconstruction of the resulting time-integrated Fourier-transform hologram of the reticle-plane illumination yields the coherence function.

FIGS. 6A and 6B show the 60 $\mu$m HOE and a blow-up of a 6 $\mu$m area. FIG. 7 shows the HOE diffraction pattern. FIG. 8 shows the coherence function over a 15-$\mu$m region at the reticle. As expected due to the discretized fill, the coherence function is periodic in the direction where the fill is discrete. The coherence periodicity is seen to be 1.13 $\mu$m. Based on a channel separation in the pupil of 0.47 times the object-side numerical aperture of 0.025, the object-plane coherence periodicity can be calculated to be 1.15 $\mu$m, closely matching the simulated value. The coherence diameter at the reticle plane is approximately 0.5 $\mu$m, slightly larger than the diffraction-limited resolution, as expected based on the desired sigma of 0.7. The time-integrated illumination uniformity as simulated in the reticle plane was found to be on the order of 0.5% peak-to-valley.

The feasibility of implementing the inventive device at EUV has been demonstrated by fabricating a visible-light analog. The off-axis, pure-phase HOE has been designed to generate the Lawrence Berkeley National Laboratory logo using the iterative phase-retrieval method. The binary-phase carrier is created by producing a two-level relief pattern onto a silicon wafer. The device is rendered uniformly reflective at visible light by aluminum plating. To create an EUV device, the aluminum coating would simply be replaced by an appropriate reflective multilayer coating. The lithographic patterning was done using an electron-beam lithography tool.

FIGS. 9A and 9B show the calculated HOE pattern used as the basis for the lithography tool patterning along with the corresponding calculated far-field diffraction pattern of FIG. 9C. The HOE pattern is 2048×2048 pixels and covers at total area of 4 mm. The HOE was designed to work at a wavelength of 633 nm and 20 degrees off normal. Accordingly, the binary pattern height is 168 nm. The black regions correspond to locations that are 168 nm taller than the white portions.

FIG. 10 shows two orders (the desired pattern and its complex conjugate) of the HOE diffraction pattern under He—Ne illumination.

This visible-light implementation demonstrated that using relatively simple binary height fabrication methods, we have the ability to produce HOEs with arbitrary diffraction patterns. Applying this to EUV would provide the basis for an arbitrary-fill illuminator. Completely redefining the fill would simply require changing one flat reflective optical element.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed:

1. An illuminator device, for an optical image processing system, wherein the image processing system comprises an optical system that employs an arbitrary pupil fill pattern, the illuminator device comprising:

a source of coherent or partially coherent radiation that generates a beam of radiation;

a holographic optical element (HOE) having a surface that receives incident radiation from said source wherein the HOE surface moves relative to the direction of the beam of radiation during exposure; and a condenser optic that re-images a surface of the holographic optical element to an entrance of said image processing system.

2. The illuminator of claim 1 further comprising filtering means for blocking all but the +1 or −1 order diffracted radiation from reaching the condenser optic.

3. The illuminator of claim 1 wherein the HOE is a transmission device constructed of a modulated amplitude grating.

4. The illuminator of claim 1 wherein the HOE is a transmission device constructed of a modulated phase grating.

5. The illuminator of claim 4 wherein the modulated phase grating is fabricated from molybdenum.

6. The illuminator of claim 5 wherein the source of radiation generates radiation with an illumination wavelength that is in the range between 10 and 15 nm.

7. The illuminator of claim 1 wherein the HOE is a reflection device constructed of an absorber patterned onto a reflector wherein the absorber pattern constitutes a modulated amplitude grating.

8. The illuminator of claim 1 wherein the HOE is a reflection device constructed of a relief-profiled on a reflector wherein the relief pattern constitutes a modulated phase grating.

9. The illuminator of claim 7 wherein the source of radiation generates radiation with an illumination wavelength that lies in the range between 10 and 15 nm and the reflector is comprised of a multilayer.

10. The illuminator of claim 8 wherein the source of radiation generates radiation with an illumination wavelength that lies in the range between 10 and 15 nm and the reflector is comprised of a multilayer.

11. The illuminator of claim 8 wherein the relief profile is that of a modulated blazed phase grating.

12. The illuminator of claim 11 wherein the source of radiation generates radiation with an illumination wavelength that lies in the range between 10 and 15 nm and the reflector is comprised of a multilayer.

13. The illuminator of claim 1 wherein the source of radiation is a synchrotron.

14. The illuminator of claim 1 wherein the source of radiation has an intrinsic coherence that is higher than a desired coherence and the illuminator device comprises a HOE which is larger than the illumination area of interest and means for translating the surface of the HOE in at least one dimension along a plane that is parallel to the surface of the HOE wherein the rate of the motion is fast relative to exposure integration time of said image processing system and wherein the range of said motion is larger than the correlation length of the HOE.

15. The illuminator of claim 14 wherein the range of motion is approximately 1000 HOE correlation lengths or greater.

16. The illuminator of claim 14 wherein 1% or better illumination uniformity is achieved by motion of HOE over a range of 10,000 correlation lengths or greater.

17. The illuminator of claim 14 wherein the means for translating the surface of the HOE moves said surface in two orthogonal dimensions along the plane parallel to the surface and the motion is $N_x$ correlation lengths in one dimension and $N_y$ correlation lengths in the other dimension providing an effective decoherence motion of $N_x$ times $N_y$ correlation lengths.

18. A method of generating an arbitrary pupil fill pattern in the entrance of an image processing system that comprises the steps of:
  (a) directing a beam of incident radiation onto a surface of a holographic optical element (HOE) wherein the radiation is coherent or partially coherent radiation wherein the HOE surface moves relative to the direction of the beam of radiation during exposure; and
  (b) re-imaging the surface of the HOE to the entrance of the image process system.

19. The method of claim 18 wherein the incident radiation is from a synchrotron.

20. The method of claim 18 wherein the radiation is extra-me ultraviolet radiation.

21. The method of claim 18 wherein the surface of the HOE has an HOE Pattern that is calculated by Fourier transform of the desired far-field diffraction pattern and modulation of a spatial carrier with a complex valued transform.

22. The method of claim 21 wherein the HOE pattern is generated by lithographic fabrication.

23. The method of claim 22 wherein the carrier is a binary pattern.

24. The method of claim 23 wherein amplitude modulation is achieved by duty-cycle modulation of the binary pattern.

25. The method of claim 23 wherein phase-only modulation is used.

26. The method of claim 25 wherein modulation of the spatial carrier with the complex valued transform employs a function of a phase-only HOE is calculated by an iterative method that comprises the steps of
  (i) generating the desired magnitude diffraction pattern, $D'(f_x,f_y)$,
  (ii) generating the seed diffraction pattern for calculation process, $D(f_x,f_y)$,
  (iii) enforcing constraints on $D(f_x,f_y)$ set by $D'(f_x,f_y)$,
  (iv) inverse Fourier transforming $D(f_x,f_y)$ to obtain an estimation of the modulating signal, $d(x,y)$,
  (v) enforcing constraints on $d(x,y)$ phase only function,
  (vi) Fourier transforming $d(x,y)$ to generate a resulting diffraction pattern, $D(f_x,f_y)$, and
  (vii) repeating steps (iii) through (vi) until the magnitude of the result of step (vi) matches the desired magnitude diffraction pattern.

27. The method of claim 26 wherein the HOE is a phase only device that is calculated by said iterative steps (i) through (vii), and incorporates a random phase obtained by seeding the iteration with a random phase term.

28. The method of claim 27 wherein the object side numerical aperture of the image processing system is approximately 0.025, the effective illuminator partial coherence has a sigma of 0.7 thereby yielding a single-sided angular bandwidth of 0.0175 and a correlation length of about 0.5 microns.

29. The method of claim 28 wherein the surface of the HOE moves approximately 50 microns in each dimension which achieves 1% illumination uniformity.

* * * * *